(12) United States Patent
Jung et al.

(10) Patent No.: US 12,197,344 B2
(45) Date of Patent: Jan. 14, 2025

(54) STORAGE DEVICE FOR LOADING MAP SEGMENT AND SENDING MAP SEGMENT TO EXTERNAL DEVICE, AND OPERATING METHOD THEREOF

(71) Applicant: SK hynix Inc., Icheon-si (KR)

(72) Inventors: Hoe Seung Jung, Icheon-si (KR); Do Hyung Kim, Icheon-si (KR); Chi Heon Kim, Icheon-si (KR); Joo Young Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 125 days.

(21) Appl. No.: 18/184,241

(22) Filed: Mar. 15, 2023

(65) Prior Publication Data

US 2024/0176747 A1    May 30, 2024

(30) Foreign Application Priority Data

Nov. 24, 2022   (KR) ........................ 10-2022-0159143

(51) Int. Cl.
　　*G06F 12/00*　　(2006.01)
　　*G06F 12/10*　　(2016.01)
　　*G11C 16/06*　　(2006.01)
(52) U.S. Cl.
　　CPC .............. *G06F 12/10* (2013.01); *G11C 16/06* (2013.01)

(58) Field of Classification Search
　　CPC ........ G06F 12/10; G06F 3/061; G06F 3/0658; G06F 3/0659; G06F 3/0656
　　See application file for complete search history.

(56) References Cited

U.S. PATENT DOCUMENTS

| | | | |
|---|---|---|---|
| 2020/0192604 A1* | 6/2020 | Byun | .................... G06F 3/0611 |
| 2020/0334138 A1* | 10/2020 | Byun | .................. G06F 12/0246 |
| 2020/0334166 A1* | 10/2020 | Byun | ...................... G06F 12/10 |
| 2021/0034242 A1* | 2/2021 | Dalmatov | ........... G06F 11/3409 |
| 2022/0004341 A1 | 1/2022 | Chen | |
| 2024/0095182 A1* | 3/2024 | Tadokoro | ............ G06F 12/0246 |

FOREIGN PATENT DOCUMENTS

KR　　10-2021-0156010 A　　12/2021

\* cited by examiner

*Primary Examiner* — John A Lane

(57) ABSTRACT

A storage device may load, between a first time point at which information on candidate memory regions among a plurality of memory regions is started to be sent to an external device and a second time point at which a command requesting a map segment for a target memory region among the plurality of memory regions is received from the external device, all or a part of map segments corresponding to the candidate memory regions into a buffer.

15 Claims, 12 Drawing Sheets

STORAGE DEVICE FOR LOADING MAP SEGMENT AND SENDING MAP SEGMENT TO EXTERNAL DEVICE, AND OPERATING METHOD THEREOF

CROSS-REFERENCE TO RELATED APPLICATION

The present application claims priority under 35 U.S.C. § 119(a) to Korean Patent Application No. 10-2022-0159143 filed in the Korean Intellectual Property Office on Nov. 24, 2022, which is incorporated herein by reference in its entirety.

BACKGROUND

1. Technical Field

Various embodiments generally relate to a storage device that loads a map segment and sends the map segment to an external device, and an operating method thereof.

2. Related Art

A storage device is a device that stores data according to a request from an external device such as a computer, a mobile terminal such as a smartphone or a tablet, or various electronic devices.

The storage device may include a controller for controlling a memory (e.g., a volatile memory/a nonvolatile memory) included in the storage device. The controller may receive a command from the external device, and may execute or control an operation for reading, writing or erasing data with respect to the memory, consistent with the received command.

To allow the external device to more quickly perform an operation of reading data, the storage device may send mapping information between a logical address and a physical address for a specific memory region, as requested by the external device, to the external device.

SUMMARY

Various embodiments are directed to a storage device and an operating method that more quickly sends mapping information, between a logical address and a physical address for a specific memory region requested by an external device, to the external device.

In an embodiment, a storage device may include: i) a memory including a plurality of memory regions; and ii) a controller configured to send information on one or more candidate memory regions selected from among the plurality of memory regions to an external device, and to load all or a part of map segments corresponding to the candidate memory regions into a buffer between a first time point when the information on the candidate memory regions begins to be sent to the external device and a second time point when a command requesting a map segment for a target memory region, from among the plurality of memory regions, is received from the external device.

In an embodiment, a method for operating a storage device may include: i) beginning to send information on one or more candidate memory regions from among a plurality of memory regions to an external device at a first time point; ii) loading all or a part of map segments corresponding to the candidate memory regions into a buffer after the first time point; iii) receiving a command requesting a map segment for a target memory region from among the plurality of memory regions at a second time point; and iv) sending the map segment for the target memory region to the external device.

In an embodiment, a controller may include: i) a memory interface capable of communicating with a memory including a plurality of memory regions; ii) a host interface capable of communicating with a host; and iii) a control circuit configured to, after an HPB recommend command indicating information on one or more candidate memory regions among the plurality of memory regions is sent to the host and before an HPB read buffer command requesting a map segment for a target memory region among the plurality of memory regions is received from the host, load in advance all or a part of map segments corresponding to the candidate memory regions into a buffer.

According to the embodiments of the disclosure, mapping information between a logical address and a physical address for a specific memory region requested by an external device may be more quickly sent to the external device.

DETAILED DESCRIPTION

Figure 1:
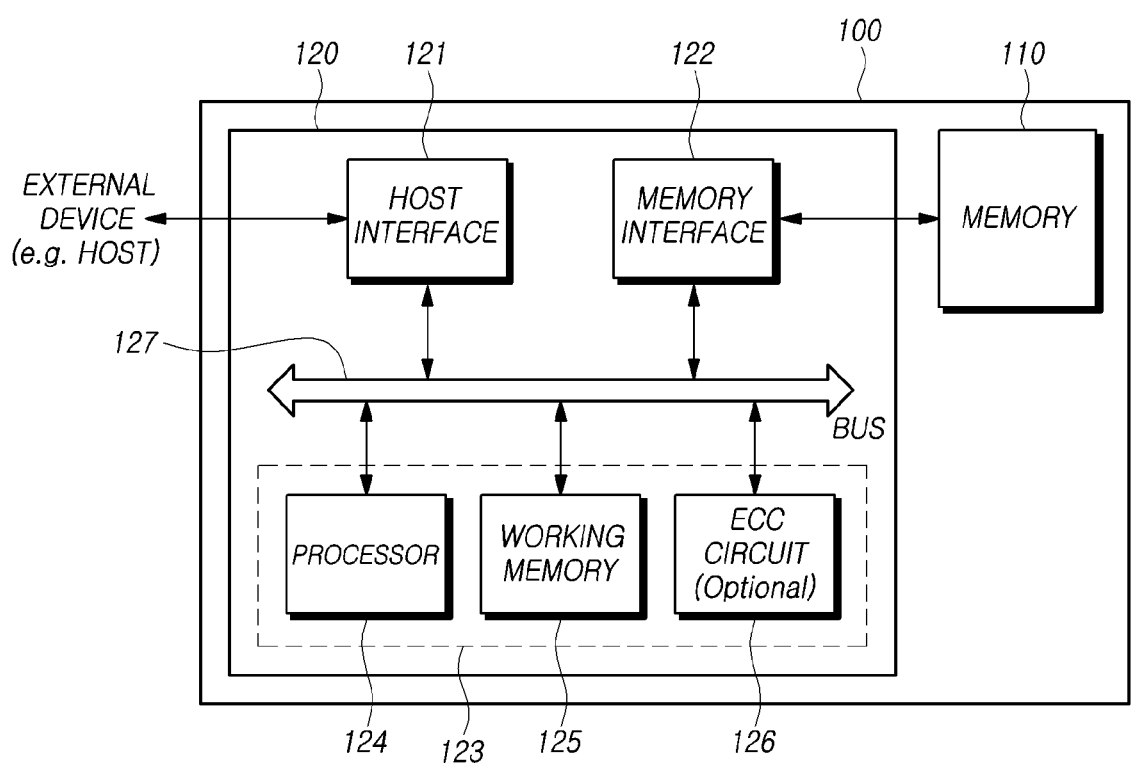
FIG. 1 is a schematic configuration diagram of a storage device according to an embodiment of the disclosure.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily limited to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a schematic configuration diagram of a storage device according to an embodiment of the disclosure.

Referring to FIG. 1, a storage device 100 may include a memory 110 that stores data and a controller 120 that controls the memory 110.

The memory 110 includes a plurality of memory blocks, and operates in response to the control of the controller 120. Operations of the memory 110 may include, for example, a read operation, a program operation (also referred to as a write operation) and an erase operation.

The memory 110 may include a memory cell array including a plurality of memory cells (also simply referred to as "cells") that store data. Such a memory cell array may exist in a memory block.

For example, the memory 110 may be realized in various types of memory such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM) and a spin transfer torque random access memory (STT-RAM).

The memory 110 may be implemented as a three-dimensional array structure. For example, embodiments of the disclosure may be applied to a charge trap flash (CTF) in which a charge storage layer is configured by a dielectric layer and a flash memory in which a charge storage layer is configured by a conductive floating gate.

The memory 110 may receive a command and an address from the controller 120 and may access an area in the memory cell array that is selected by the address. In other words, the memory 110 may perform an operation indicated by the command, on the area selected by the address.

The memory 110 may perform a program operation, a read operation or an erase operation. For example, when performing the program operation, the memory 110 may program data to the area selected by the address. When performing the read operation, the memory 110 may read data from the area selected by the address. In the erase operation, the memory 110 may erase data stored in the area selected by the address.

The controller 120 may control write (program), read, erase and background operations for the memory 110. For example, background operations may include at least one from among a garbage collection (GC) operation, a wear leveling (WL) operation, a read reclaim (RR) operation, a bad block management (BBM) operation, and so forth.

The controller 120 may control the operation of the memory 110 according to a request from a device (e.g., a host) located outside the storage device 100. The controller 120, however, also may control the operation of the memory 110 regardless or in the absence of a request of the host.

The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an REID (radio frequency identification) device, and a mobility device (e.g., a vehicle, a robot or a drone) capable of driving under human control or autonomous driving, as non-limiting examples.

The host may include at least one operating system (OS). The operating system may generally manage and control the function and operation of the host, and may provide interoperability between the host and the storage device 100. The operating system may be classified into a general operating system and a mobile operating system depending on the mobility of the host.

The controller 120 and the host may be devices that are separated from each other, or the controller 120 and the host may be integrated into one device. Hereunder, for the sake of convenience in explanation, descriptions will describe the controller 120 and the host as devices that are separated from each other.

Referring to FIG. 1, the controller 120 may include a memory interface 122 and a control circuit 123, and may further include a host interface 121.

The host interface 121 provides an interface for communication with the host. For example, the host interface 121 provides an interface that uses at least one from among various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer system interface) protocol, an ESDI (enhanced small disk interface) protocol, an IDE (integrated drive electronics) protocol and a private protocol.

When receiving a command from the host, the control circuit 123 may receive the command through the host interface 121, and may perform an operation of processing the received command.

The memory interface 122 may be coupled with the memory 110 to provide an interface for communication with the memory 110. That is to say, the memory interface 122 may be configured to provide an interface between the memory 110 and the controller 120 in response to the control of the control circuit 123.

The control circuit 123 performs the general control operations of the controller 120 to control the operation of the memory 110. To this end, for instance, the control circuit 123 may include at least one of a processor 124 and a working memory 125, and may optionally include an error detection and correction circuit (ECC circuit) 126.

The processor 124 may control general operations of the controller 120, and may perform a logic calculation. The processor 124 may communicate with the host through the host interface 121, and may communicate with the memory 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 may randomize data received from the host. For example, the processor 124 may randomize data received from the host by using a set randomizing seed. The randomized data may be provided to the memory 110, and may be programmed to a memory cell array of the memory 110.

In a read operation, the processor 124 may derandomize data received from the memory 110. For example, the processor 124 may derandomize data received from the memory 110 by using a derandomizing seed. The derandomized data may be outputted to the host.

The processor 124 may execute firmware to control the operation of the controller 120. Namely, in order to control the general operation of the controller 120 and perform a logic calculation, the processor 124 may execute (drive) firmware loaded in the working memory 125 upon booting. Hereafter, an operation of the storage device 100 according to embodiments of the disclosure will be described as implementing a processor 124 that executes firmware in which the corresponding operation is defined.

Firmware, as a program to be executed in the storage device 100 to drive the storage device 100, may include various functional layers. For example, the firmware may include binary data in which codes for executing the functional layers, respectively, are defined.

For example, the firmware may include at least one from among a flash translation layer (FTL), which performs a translating function between a logical address requested to the storage device 100 from the host and a physical address of the memory 110; a host interface layer (HIL), which serves to analyze a command requested to the storage device 100 as a storage device from the host and transfer the command to the flash translation layer (FTL); and a flash interface layer (FIL), which transfers a command, instructed from the flash translation layer (FTL), to the memory 110.

Such firmware may be loaded in the working memory 125 from, for example, the memory 110 or a separate nonvolatile memory (e.g., a ROM or a NOR Flash) located outside the memory 110. The processor 124 may first load all or a part of the firmware in the working memory 125 when executing a booting operation after power-on.

The processor 124 may perform a logic calculation, which is defined in the firmware loaded in the working memory 125, to control the general operation of the controller 120. The processor 124 may store a result of performing the logic calculation defined in the firmware, in the working memory 125. The processor 124 may control the controller 120 according to a result of performing the logic calculation defined in the firmware such that the controller 120 generates a command or a signal. When a part of firmware, in which a logic calculation to be performed is defined, is stored in the memory 110, but not loaded in the working memory 125, the processor 124 may generate an event (e.g., an interrupt) for loading the corresponding part of the firmware into the working memory 125 from the memory 110.

The processor 124 may load metadata necessary for driving firmware from the memory 110. The metadata, as data for managing the memory 110, may include for example management information on user data stored in the memory 110.

Firmware may be updated while the storage device 100 is manufactured or while the storage device 100 is operating. The controller 120 may download new firmware from the outside of the storage device 100 and update existing firmware with the new firmware.

To drive the controller 120, the working memory 125 may store necessary firmware, a program code, a command and data. The working memory 125 may be a volatile memory that includes, for example, at least one from among an SRAM (static RAM), a DRAM (dynamic RAM) and an SDRAM (synchronous DRAM).

The error detection and correction circuit 126 may detect an error bit of target data, and correct the detected error bit by using an error correction code. The target data may be, for example, data stored in the working memory 125 or data read from the memory 110.

The error detection and correction circuit 126 may decode data by using an error correction code. The error detection and correction circuit 126 may be realized by various code decoders. For example, a decoder that performs unsystematic code decoding or a decoder that performs systematic code decoding may be used.

For example, the error detection and correction circuit 126 may detect an error bit by the unit of a set sector in each of the read data, when each read data is constituted by a plurality of sectors. A sector may mean a data unit that is smaller than a page, which is the read unit of a flash memory. Sectors constituting each read data may be matched with one another using an address.

The error detection and correction circuit 126 may calculate a bit error rate (BER), and may determine whether an error is correctable or not, by sector units. For example, when a bit error rate (BER) is higher than a reference value, the error detection and correction circuit 126 may determine that a corresponding sector is uncorrectable or a fail. On the other hand, when a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, then the error detection and correction circuit 126 may detect a sector which is uncorrectable in read data last. There may be one or more sectors that are determined to be uncorrectable. The error detection and correction circuit 126 may transfer information (e.g., address information) regarding a sector which is determined to be uncorrectable to the processor 124.

A bus 127 may be configured to provide channels among the components 121, 122, 124, 125 and 126 of the controller 120. The bus 127 may include, for example, a control bus for transferring various control signals, commands and the like, a data bus for transferring various data, and so forth.

Some components among the above-described components 121, 122, 124, 125 and 126 of the controller 120 may be omitted, or some components among the above-described components 121, 122, 124, 125 and 126 of the controller 120 may be integrated into one component. In addition to the above-described components 121, 122, 124, 125 and 126 of the controller 120, one or more other components may be added.

Hereinbelow, the memory 110 will be described in further detail with reference to FIG. 2.

Figure 2:
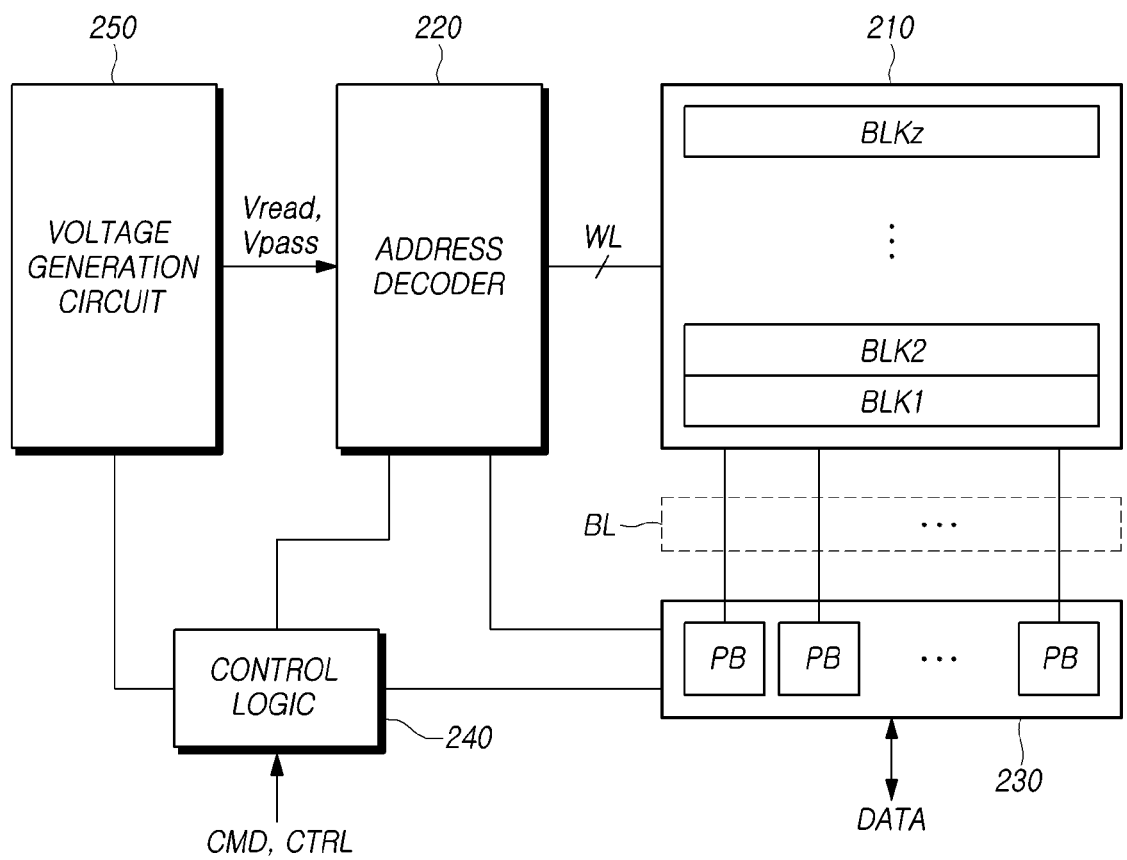
FIG. 2 is a block diagram schematically illustrating a memory of FIG. 1.

FIG. 2 is a block diagram schematically illustrating a memory of FIG. 1.

Referring to FIG. 2, a memory 110 according to an embodiment of the disclosure may include a memory cell array 210, an address decoder 220, a read and write circuit 230, a control logic 240, and a voltage generation circuit 250.

The memory cell array 210 may include a plurality of memory blocks BLK1 to BLKz (where z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells that have vertical channel structures.

The memory cell array 210 may be configured by a memory cell array of a two-dimensional structure or may be configured by a memory cell array of a three-dimensional structure.

Each of the plurality of memory cells included in the memory cell array 210 may store at least 1-bit data. For instance, each of the plurality of memory cells included in the memory cell array 210 may be a signal level cell (SLC) that stores 1-bit data. In another instance, each of the plurality of memory cells included in the memory cell array 210 may be a multi-level cell (MLC) that stores 2-bit data.

In still another instance, each of the plurality of memory cells included in the memory cell array 210 may be a triple level cell (TLC) that stores 3-bit data. In yet another instance, each of the plurality of memory cells included in the memory cell array 210 may be a quad level cell (QLC) that stores 4-bit data. In a further instance, the memory cell array 210 may include a plurality of memory cells, each of which stores 5 or more-bit data.

The number of bits of data stored in each of the plurality of memory cells may be dynamically determined. For example, a single-level cell that stores 1-bit data may be changed to a triple-level cell that stores 3-bit data.

Referring to FIG. 2, the address decoder 220, the read and write circuit 230, the control logic 240 and the voltage generation circuit 250 may operate as a peripheral circuit that drives the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory 110 may be performed by the unit of a page. An address received when a read operation or a program operation is requested may include at least one from among a block address, a row address and a column address.

The address decoder 220 may select one memory block and one word line depending on a block address and a row address. A column address may be decoded by the address decoder 220 and be provided to the read and write circuit 230.

The address decoder 220 may include at least one from among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit that includes a plurality of page buffers PB. The read and write circuit 230 may include data buffers that take charge of a data processing function, and may further include cache buffers that take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, changes in the amounts of current flowing, depending on the programmed states of the corresponding memory cells.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory 110. As an exemplary embodiment, the read and write circuit 230 may include a column select circuit in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory 110.

The control logic 240 may be configured to control general operations of the memory 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Each memory block of the memory 110 described above may be configured by a plurality of pages corresponding to a plurality of word lines WL and a plurality of strings corresponding to a plurality of bit lines BL.

In a memory block BLK, a plurality of word lines WL and a plurality of bit lines BL may be disposed to intersect with each other. For example, each of the plurality of word lines WL may be disposed in a row direction, and each of the plurality of bit lines BL may be disposed in a column direction. In another example, each of the plurality of word lines WL may be disposed in a column direction, and each of the plurality of bit lines BL may be disposed in a row direction.

A memory cell may be coupled to one of the plurality of word lines WL and one of the plurality of bit lines BL. A transistor may be disposed in each memory cell.

For example, a transistor disposed in each memory cell (MC) may include a drain, a source and a gate. The drain (or source) of the transistor may be coupled with a corresponding bit line BL directly or via another transistor. The source (or drain) of the transistor may be coupled with a source line (which may be the ground) directly or via another transistor. The gate of the transistor may include a floating gate, which is surrounded by a dielectric, and a control gate to which a gate voltage is applied from a word line WL.

In each memory block, a first select line (also referred to as a source select line or a drain select line) may be additionally disposed outside a first outermost word line more adjacent to the read and write circuit 230 between two outermost word lines, and a second select line (also referred to as a drain select line or a source select line) may be additionally disposed outside a second outermost word line between the two outermost word lines.

At least one dummy word line may be additionally disposed between the first outermost word line and the first select line. At least one dummy word line may also be additionally disposed between the second outermost word line and the second select line.

A read operation and a program operation (write operation) of the memory block described above may be performed by the unit of a page, and an erase operation may be performed by the unit of a memory block.

Figure 3:
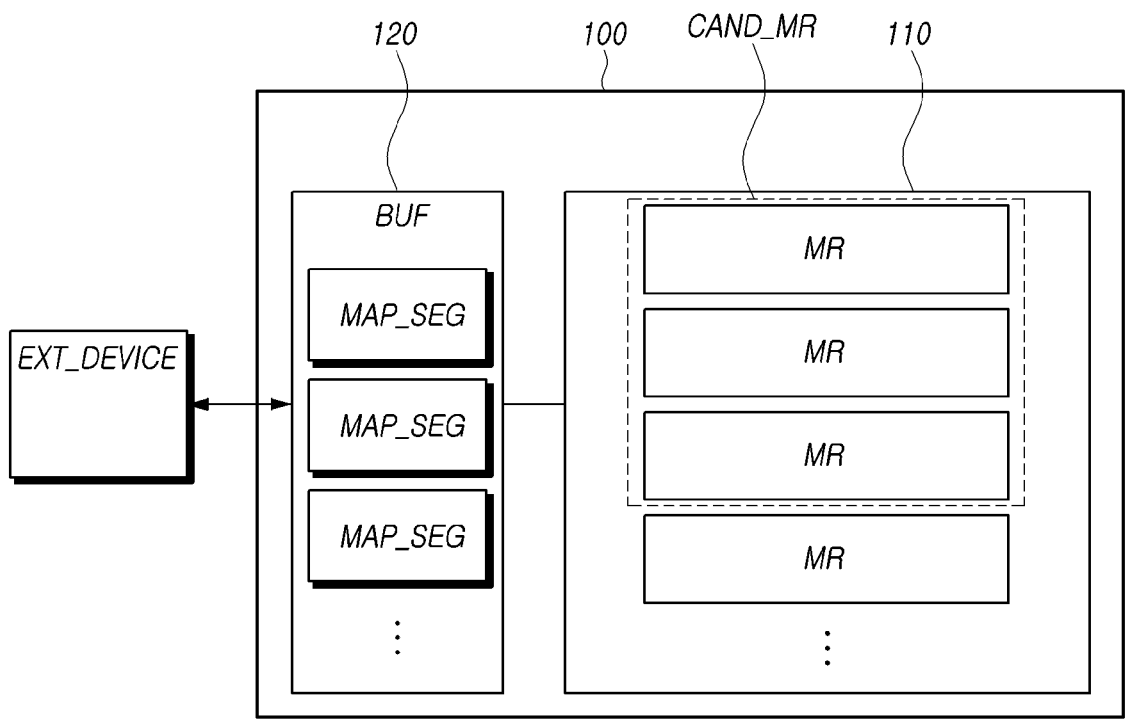
FIG. 3 is a diagram illustrating a structure of a storage device according to an embodiment of the disclosure.

FIG. 3 is a diagram illustrating a structure of a storage device according to an embodiment of the disclosure.

Referring to FIG. 3, a storage device 100 may include a memory 110 and a controller 120. For example, the storage device 100 may be a UFS (Universal Flash Storage) device.

The memory 110 may include a plurality of memory regions MR. Each of the plurality of memory regions MR is a region capable of storing data of a specific size. For example, each of the plurality of memory regions MR may be one or more memory blocks or one or more pages.

The controller 120 may communicate with an external device EXT_DEVICE located outside the storage device 100. For example, the external device EXT_DEVICE may be an HPB (host performance booster) host that is defined on an HPB of the UFS standard.

The controller 120 may send information on one or more candidate memory regions CAND_MR, from among the plurality of memory regions MR, to the external device EXT_DEVICE.

The candidate memory regions CAND_MR may be memory regions, among the plurality of memory regions MR, that are highly likely to be accessed by the external device EXT_DEVICE. For example, the controller 120 may manage information on the candidate memory regions CAND_MR as a list.

The controller 120 may determine the candidate memory regions CAND_MR in various ways.

For example, the controller 120 may select memory regions MR that are frequently read by the external device EXT_DEVICE to include in the candidate memory regions CAND_MR. The controller 120 may determine, as the candidate memory regions CAND_MR, memory regions MR whose read counts by the external device EXT_DEVICE for a preset time period are equal to or greater than a set threshold count.

In another example, the controller 120 may determine, as the candidate memory regions CAND_MR, memory regions MR in which the sizes of data read by the external device EXT_DEVICE for a preset time period are equal to or larger than a set threshold data size.

In still another example, the controller 120 may determine an N (where N is a natural number) number of memory regions MR that were most recently accessed, from among the plurality of memory regions MR, to include in the candidate memory regions CAND_MR.

The controller 120 may include a buffer BUF. The buffer BUF may store map segments MAP_SEG to be sent to the external device EXT_DEVICE.

For example, the buffer BUF may be the working memory 125 described above or a partial region of the working memory 125.

In another example, the buffer BUF may be a volatile memory (e.g., an SRAM or a DRAM) in the controller 120 that exists separately from the working memory 125.

Each of the map segments MAP_SEG may indicate a physical address range that is mapped to a specific logical address range.

Each of the map segments MAP_SEG stored in the buffer BUF may include one or more pieces of mapping information. Each piece of mapping information may indicate the mapping relationship between one logical address and one physical address.

Hereinafter, operations of the aforementioned storage device 100 and an external device EXT_DEVICE will be described using a sequence diagram.

Figure 4:
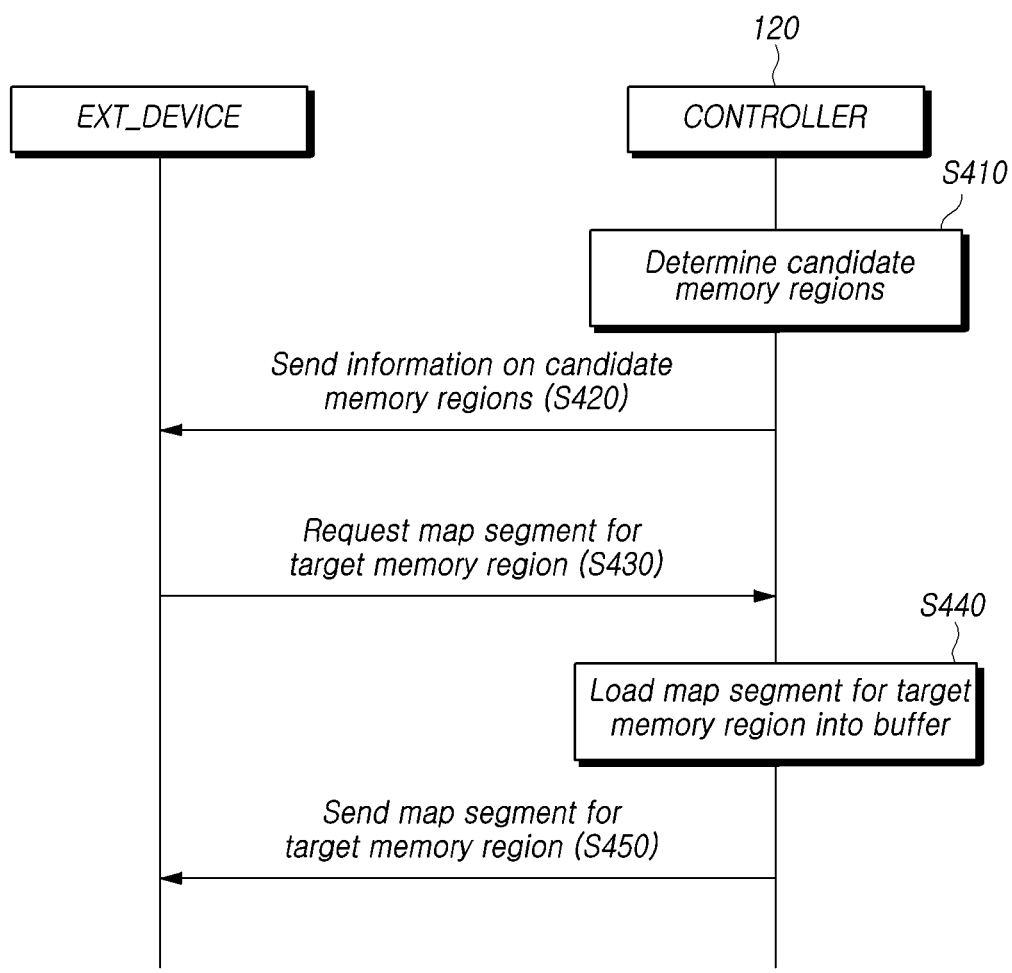
FIG. 4 is a sequence diagram illustrating an example of operations of a storage device and an external device according to an embodiment of the disclosure.

FIG. 4 is a sequence diagram illustrating an example of operations of a storage device and an external device according to an embodiment of the disclosure.

Referring to FIG. 4, first, a controller 120 of a storage device 100 may determine one or more candidate memory regions CAND_MR from among the plurality of memory regions MR (S410).

The controller 120 may send information on the determined candidate memory regions CAND_MR to the external device EXT_DEVICE (S420).

For example, the information on the candidate memory regions CAND_MR may include at least one from among identifiers for identifying the candidate memory regions CAND_MR, start addresses and sizes of the respective candidate memory regions CAND_MR, and counts by which read operations are executed on the candidate memory regions CAND_MR.

The external device EXT_DEVICE may request a map segment for a target memory region (S430).

The target memory region may be selected from among the candidate memory regions CAND_MR. In another example, the target memory region may be selected from among memory regions MR other than the candidate memory regions CAND_MR. That is to say, the external device EXT_DEVICE may select a target memory region from among the plurality of memory regions MR, but the target memory region may be selected from among memory regions MR other than the candidate memory regions CAND_MR.

In order to process a request received from an external device EXT_DEVICE, the controller 120 may load a map segment for a target memory region into the buffer BUF (S440).

The controller 120 may load the map segment for the target memory region from the memory 110, or may load the map segment for the target memory region from a map cache, which caches map segments in advance.

The controller 120 may send the map segment for the target memory region to the external device EXT_DEVICE (S450).

The controller 120 loads the map segment for the target memory region after receiving a request for the map segment for the target memory region from the external device EXT_DEVICE.

Figure 5:
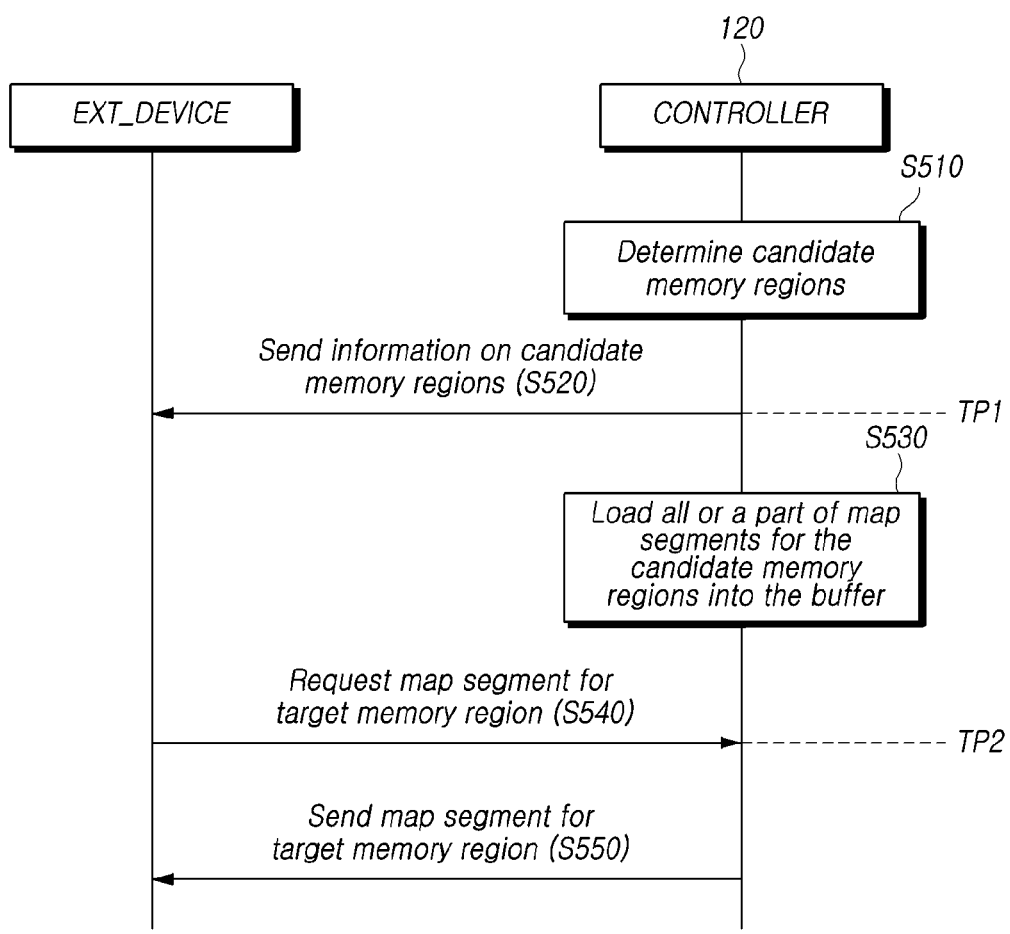
FIG. 5 is a sequence diagram illustrating another example of operations of a storage device and an external device according to an embodiment of the disclosure and an external device.

FIG. 5 is a sequence diagram illustrating another example of operations of a storage device and an external device according to an embodiment of the disclosure.

Referring to FIG. 5, a controller 120 of a storage device 100 may determine one or more candidate memory regions CAND_MR from among a plurality of memory regions MR (S510).

The controller 120 may send information on the determined candidate memory regions CAND_MR to the external device EXT_DEVICE (S520). For example, the controller 120 may send the information on the selected candidate memory regions CAND_MR to the external device EXT_DEVICE through an HPB recommend command. The information on the candidate memory regions CAND_MR may be referred to as hint information.

After a first time point TP1, which is a time point at which the controller 120 starts to send the information on the candidate memory regions CAND_MR to the external device EXT_DEVICE, the controller 120 may load all or a part of map segments for the candidate memory regions CAND_MR into the buffer BUF (S530).

In other words, before receiving a command requesting a map segment for a target memory region from the external device EXT_DEVICE, the controller 120 may load all or a part of map segments for the candidate memory regions CAND_MR into the buffer BUF. The candidate memory regions CAND_MR are memory regions that may be selected as the target memory region.

The external device EXT_DEVICE may request the map segment for the target memory region from among the plurality of memory regions MR (S540). The controller 120 may receive a command requesting the map segment for the target memory region from the external device EXT_DEVICE at a second time point TP2. For example, the command requesting the map segment for the target memory region may be an HPB read buffer command.

The controller 120 may send the map segment for the target memory region to the external device EXT_DEVICE (S550).

When the target memory region is one of the candidate memory regions CAND_MR, the controller 120 may load the map segment for the target memory region into the buffer BUF in advance, before receiving the command requesting the map segment for the target memory region from the external device EXT_DEVICE. Accordingly, the controller 120 may send the map segment for the target memory region to the external device EXT_DEVICE immediately after receiving the command requesting the map segment for the target memory region.

As a result, the controller 120 may more quickly send the map segment for the target memory region to the external device EXT_DEVICE because the map segment is preloaded into the buffer BUF.

Figure 6:
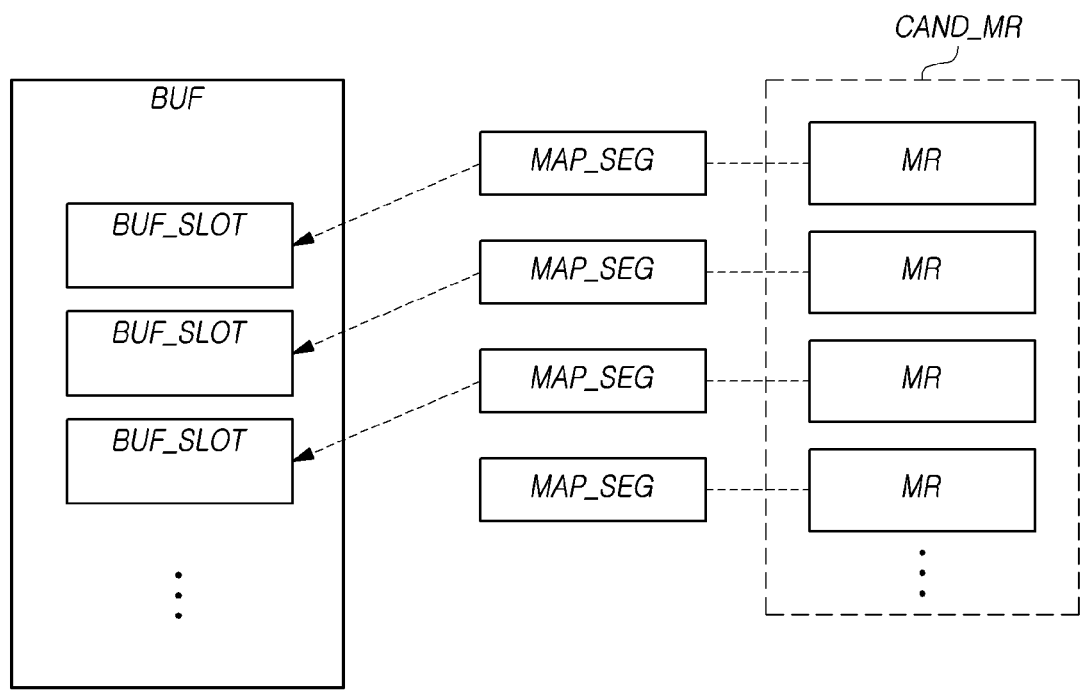
FIG. 6 is a diagram illustrating an example of a structure of a buffer according to an embodiment of the disclosure.

FIG. 6 is a diagram illustrating an example of a structure of a buffer according to an embodiment of the disclosure.

Referring to FIG. 6, a buffer BUF may include a plurality of buffer slots BUF_SLOT.

In FIG. 6, each of the buffer slots BUF_SLOT may store one map segment MAP_SEG.

As described above with reference to FIG. 5, a controller 120 may load all or a part of the map segments MAP_SEG corresponding to candidate memory regions CAND_MR between a first time point TP1 and a second time point TP2.

The order in which the controller 120 loads all or a part of the map segments MAP_SEG corresponding to the candidate memory regions CAND_MR may be variously determined.

For example, the controller 120 may determine an order of loading all or a part of the map segments MAP_SEG corresponding to the candidate memory regions CAND_MR into the plurality of buffer slots BUF_SLOT according to the identifiers of the map segments MAP_SEG.

In another example, the controller 120 may determine an order of loading all or a part of the map segments MAP_SEG corresponding to the candidate memory regions CAND_MR into the plurality of buffer slots BUF_SLOT according to counts that the candidate memory regions CAND_MR are accessed by the external device EXT_DEVICE.

When the controller 120 sends information on a maximum of K number of candidate memory regions CAN- D_MR, the number of buffer slots BUF_SLOT included in the buffer BUF may be less than K.

For example, when the controller 120 sends information on a maximum of 8 candidate memory regions CAND_MR to the external device EXT_DEVICE, the number of buffer slots BUF_SLOT may be a value (e.g., 4) that is less than 8.

In this case, map segments MAP_SEG for the K number of candidate memory regions CAND_MR cannot be simultaneously loaded into the buffer BUF. Thus, in order to load a map segment MAP_SEG for a specific candidate memory region CAND_MR, one of the map segments MAP_SEG already loaded into the buffer BUF may be evicted from the buffer BUF.

Figure 7:
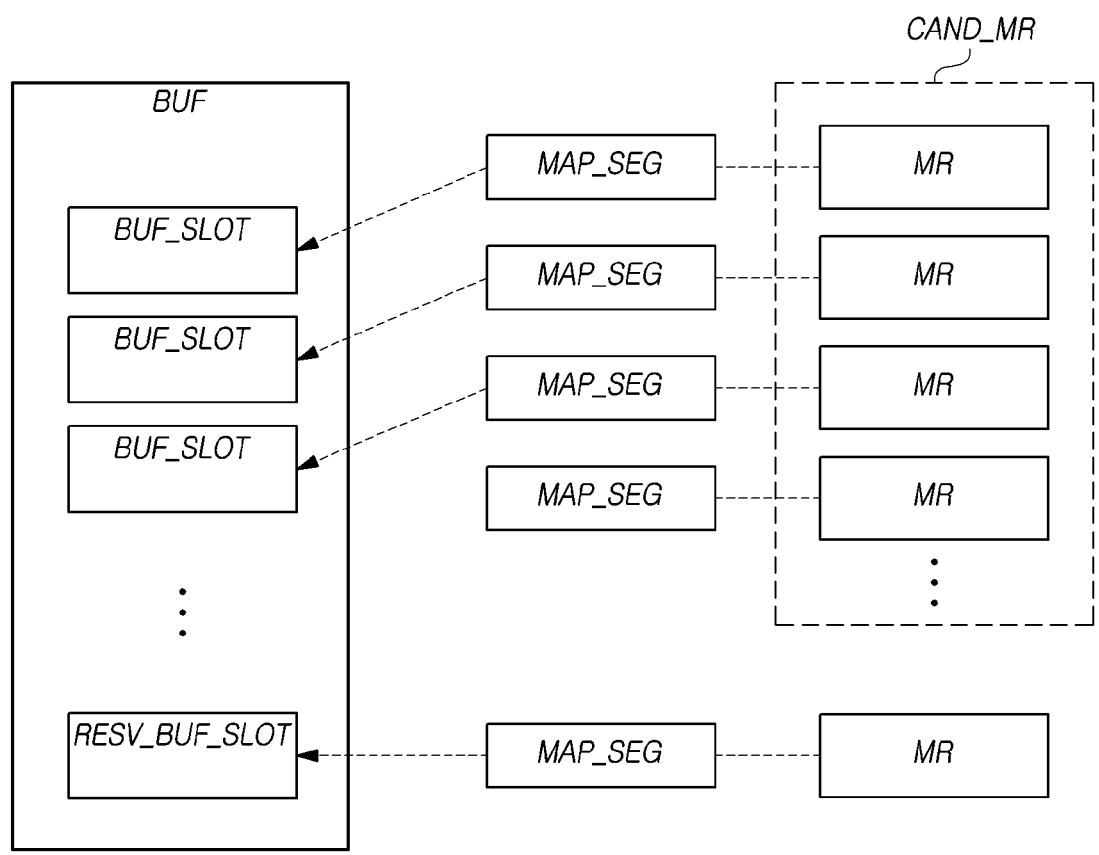
FIG. 7 is a diagram illustrating another example of a structure of a buffer according to an embodiment of the disclosure.

FIG. 7 is a diagram illustrating another example of a structure of a buffer according to an embodiment of the disclosure.

Referring to FIG. 7, a buffer BUF may further include a reserved buffer slot RESV_BUF_SLOT in addition to buffer slots BUF_SLOT described above.

When the aforementioned target memory region is not included in candidate memory regions CAND_MR, the reserved buffer slot RESV_BUF_SLOT may be used by a controller 120 to load a map segment corresponding to the target memory region.

When the target memory region is not included in the candidate memory regions CAND_MR, in order for the controller 120 to load the map segment corresponding to the target memory region, the controller 120 searches for the map segments MAP_SEG corresponding to the candidate memory regions CAND_MR in the buffer BUF, and evict the part of the map segments MAP_SEG from the buffer BUF. The time required for the controller 120 to load the map segment corresponding to the target memory region and to send the map segment corresponding to the target memory region to the external device EXT_DEVICE is longer.

Therefore, in order to prevent delays when the target memory region is not included in the candidate memory regions CAND_MR, the controller 120 may additionally use the reserved buffer slot RESV_BUF_SLOT for the map segment corresponding to the target memory region.

Figure 8:
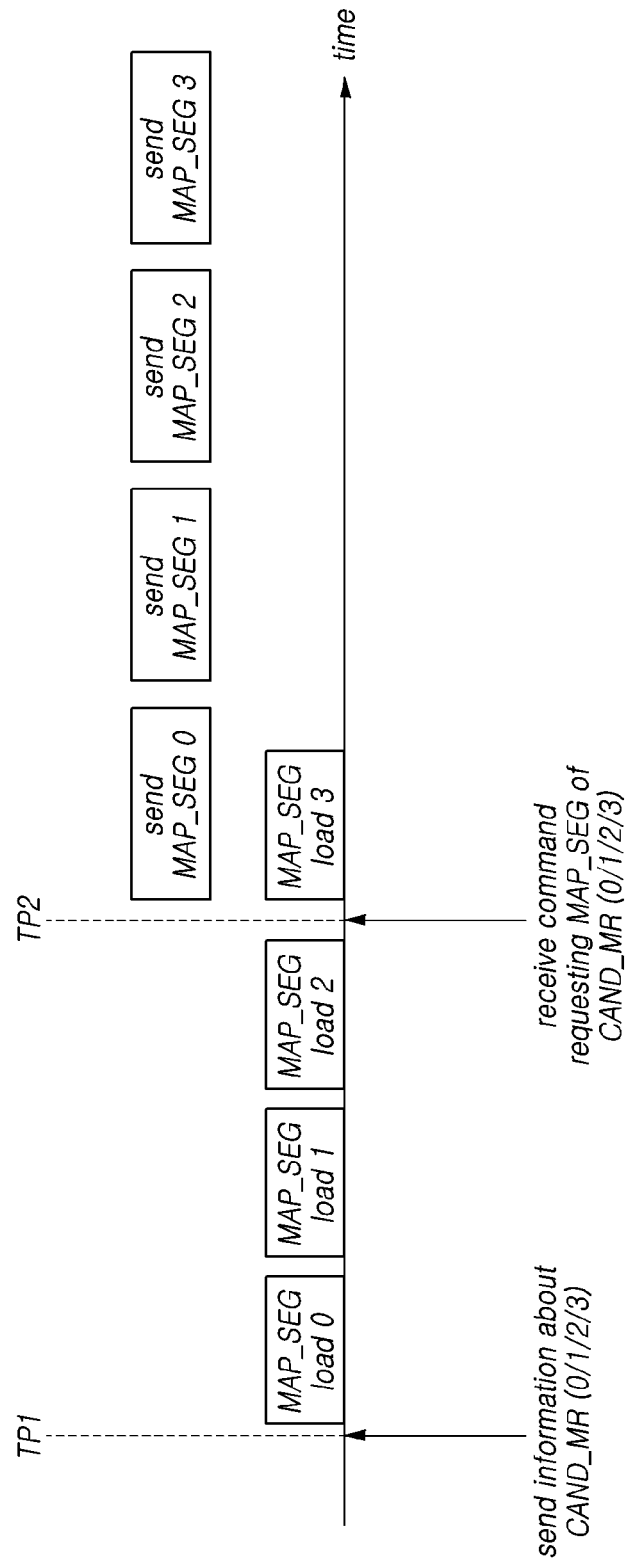
FIG. 8 is a diagram illustrating an example of an operation in which a storage device loads a plurality of map segments and sends the plurality of map segments to an external device according to an embodiment of the disclosure.

FIG. 8 is a diagram illustrating an example of an operation in which a storage device loads a plurality of map segments and sends the plurality of map segments to an external device according to an embodiment of the disclosure.

Referring to FIG. 8, a controller 120 of a storage device 100 may load map segments MAP_SEG for four candidate memory regions CAND_MR, and then, may send the loaded map segments MAP_SEG to an external device EXT_DEVICE. Identifiers of the four candidate memory regions CAND_MR are 0, 1, 2 and 3, respectively.

However, in other embodiments of the disclosure, the number of candidate memory regions CAND_MR is not limited to 4. Also, identifiers of the candidate memory regions CAND_MR are not limited to 0, 1, 2 and 3.

In FIG. 8, at a first time point TP1, the controller 120 may send information on the candidate memory regions CAND_MR to the external device EXT_DEVICE.

The controller 120 may load the map segments MAP_SEG for the candidate memory regions CAND_MR into the buffer BUF. The controller 120 may first load the map segment MAP_SEG for the candidate memory region CAND_MR 0 into the buffer BUF, may next load the map segment MAP_SEG for the candidate memory region CAND_MR 1 into the buffer BUF, and may then load the map segment MAP_SEG for the candidate memory region CAND_MR 2 into the buffer BUF.

Thereafter, the controller 120 may receive a command requesting the map segments MAP_SEG for the candidate memory regions CAND_MR 0, 1, 2 and 3 from the external device EXT_DEVICE.

At this time, the controller 120 may load the map segment MAP_SEG for the candidate memory region CAND_MR 3 (which has not yet been loaded into the buffer BUF) into the buffer BUF, and simultaneously, may send the map segment MAP_SEG for the candidate memory region CAND_MR 0, which has already been loaded into the buffer BUF, to the external device EXT_DEVICE.

Then, the controller 120 may send the map segments MAP_SEG for the candidate memory regions CAND_MR 1, 2 and 3 loaded into the buffer BUF to the external device EXT_DEVICE.

As described above, the controller 120 sends the map segments MAP_SEG loaded into the buffer BUF to the external device EXT_DEVICE.

In another embodiment, the controller 120 may additionally perform an encoding operation when sending the map segments MAP_SEG loaded into the buffer BUF to the external device EXT_DEVICE.

Figure 9:
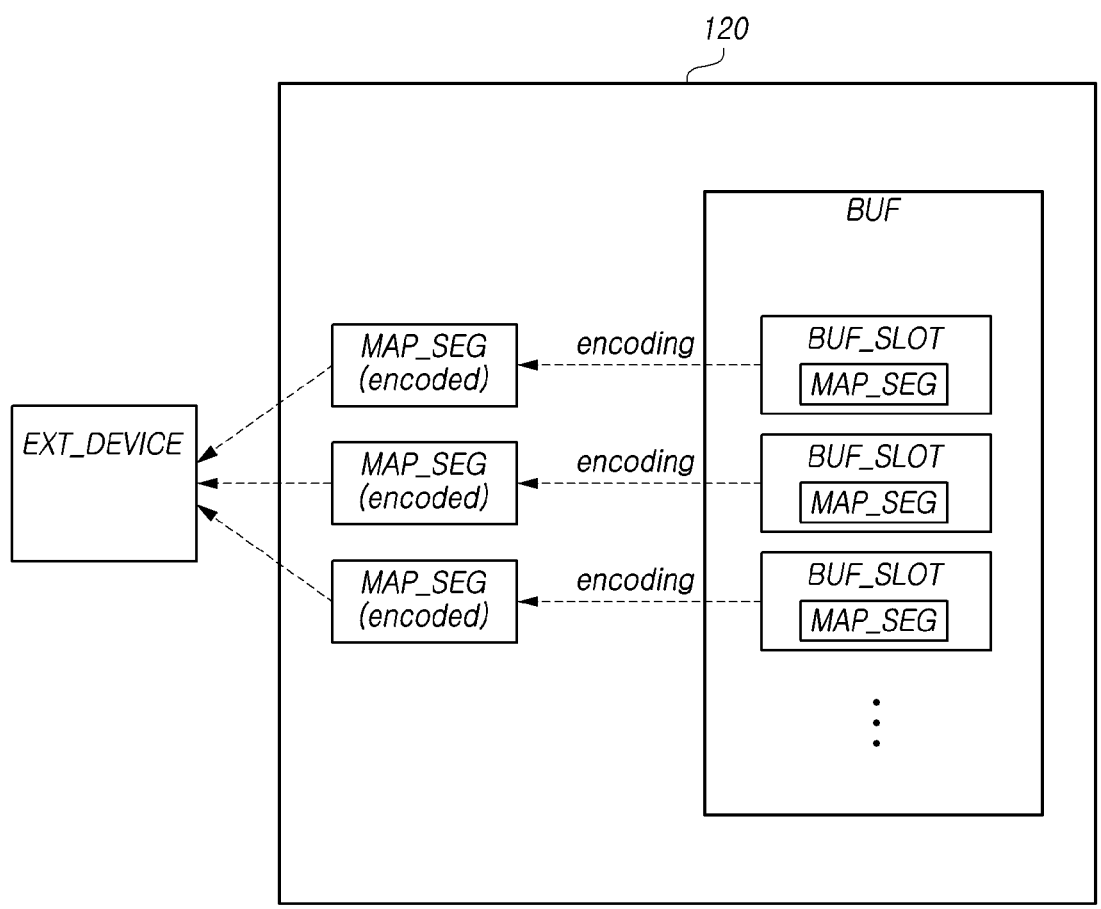
FIG. 9 is a diagram illustrating an example of an operation in which a storage device encodes loaded map segments and then sends encoded map segments to an external device according to an embodiment of the disclosure.

FIG. 9 is a diagram illustrating an example of an operation in which a storage device encodes loaded map segments and then sends encoded map segments to an external device according to an embodiment of the disclosure.

Referring to FIG. 9, a controller 120 of a storage device 100 may encode, in parallel, all or a part of map segments MAP_SEG loaded into a plurality of buffer slots BUF_SLOT included in a buffer BUF, according to a set encoding algorithm.

For example, the controller 120 may include a plurality of encoding circuits (not illustrated) to encode in parallel the map segments MAP_SEG loaded into the buffer slots BUF_SLOT.

For example, the plurality of encoding circuits (not illustrated) may be processor cores that are included in the processor 124.

In another example, the plurality of encoding circuits (not illustrated) may be separate circuits capable of executing the above-described encoding algorithm.

In still another example, the controller 120 may generate a plurality of encoding processes to encode in parallel the map segments MAP_SEG loaded into the buffer slots BUF_SLOT. Each encoding process may encode one of the map segments MAP_SEG loaded into the buffer slots BUF_SLOT.

Figure 10:
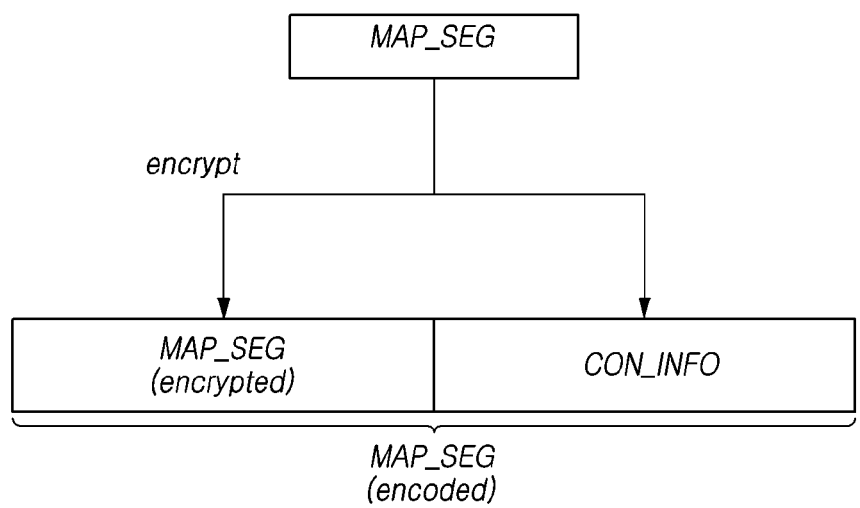
FIG. 10 is a diagram illustrating an example of an encoding algorithm that is used by a storage device in an operation of encoding a map segment according to an embodiment of the disclosure.

FIG. 10 is a diagram illustrating an example of an encoding algorithm that is used by a storage device in an operation of encoding a map segment according to an embodiment of the disclosure.

Referring to FIG. 10, an encoding algorithm may encrypt a map segment MAP_SEG according to a set encryption algorithm (e.g., AES, DES, ARIA or HIGHT).

The encoding algorithm may additionally generate consistency information CON_INFO (e.g., checksum, parity or hash) for the encrypted map segment MAP_SEG. For example, the consistency information CON_INFO may be a checksum, a parity or a hash.

The consistency information CON_INFO is used to determine that a map segment received by the external device EXT_DEVICE has been encoded by the controller 120 and that no modulation has occurred during sending.

The controller 120 may simultaneously execute an operation of loading a map segment into a first buffer slot, from among the plurality of buffer slots BUF_SLOT included in the buffer BUF, and an operation of encoding a map segment loaded into a second buffer slot, to send the map segment to the external device EXT_DEVICE. Hereinafter, this will be described in detail with reference to FIG. 11.

Figure 11:
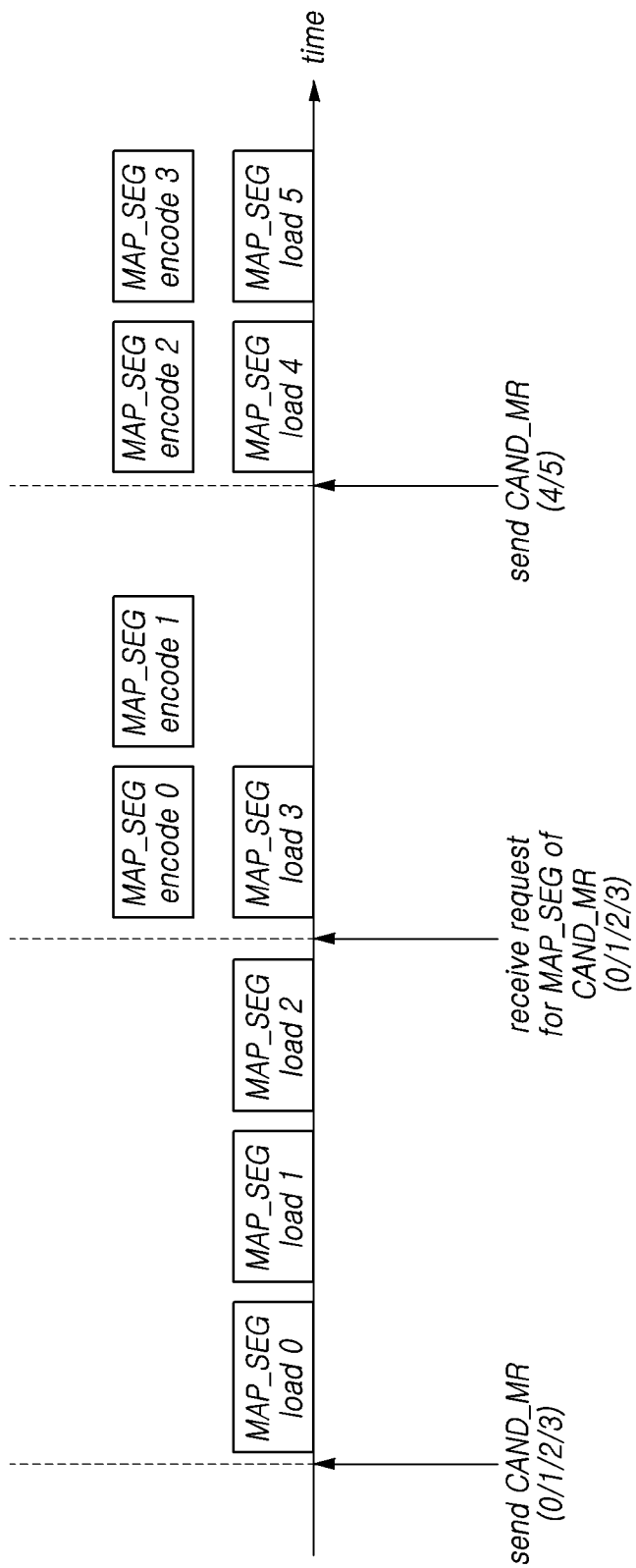
FIG. 11 is a diagram illustrating an example of an operation in which a storage device loads and encodes a plurality of map segments according to an embodiment of the disclosure

FIG. 11 is a diagram illustrating an example of an operation in which a storage device loads and encodes a plurality of map segments according to an embodiment of the disclosure.

Referring to FIG. 11, a controller 120 of a storage device 100 may first load map segments MAP_SEG for four candidate memory regions CAND_MR, and then may send the loaded map segments MAP_SEG to an external device EXT_DEVICE. Identifiers of the four candidate memory regions CAND_MR are 0, 1, 2 and 3, respectively.

In FIG. 11, the controller 120 may send information on the candidate memory regions CAND_MR 0, 1, 2 and 3 to the external device EXT_DEVICE.

The controller 120 may load the map segments MAP_SEG for the candidate memory regions CAND_MR 0, 1, 2 and 3 into the buffer BUF. The controller 120 may first load the map segment MAP_SEG for the candidate memory region CAND_MR 0 into the buffer BUF, may next load the map segment MAP_SEG for the candidate memory region CAND_MR 1 into the buffer BUF, and may then load the map segment MAP_SEG for the candidate memory region CAND_MR 2 into the buffer BUF.

Thereafter, the controller 120 may receive a command requesting the map segments MAP_SEG for the candidate memory regions CAND_MR 0, 1, 2 and 3 from the external device EXT_DEVICE.

At this time, the controller 120 may load the map segment MAP_SEG for the candidate memory region CAND_MR 3 (which has not yet been loaded into the buffer BUF) into the buffer BUF, and simultaneously, may encode the map segment MAP_SEG for the candidate memory region CAND_MR 0, which has already been loaded into the buffer BUF.

Thereafter, the controller 120 may additionally send information on candidate memory regions CAND_MR 4 and 5 to the external device EXT_DEVICE.

The controller 120 may load map segments MAP_SEG for the candidate memory regions CAND_MR 4 and 5 into the buffer BUF, and simultaneously, may encode the map segments MAP_SEG for the candidate memory regions CAND_MR 2 and 3, which have already been loaded into the buffer BUF.

Figure 12:
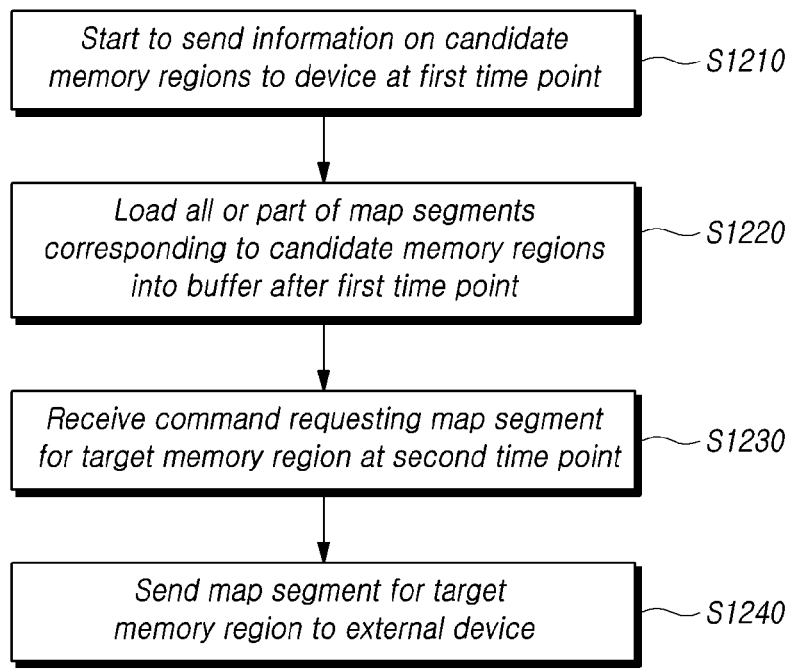
FIG. 12 is a diagram illustrating a method for operating a storage device according to an embodiment of the disclosure.

FIG. 12 is a diagram illustrating a method for operating a storage device according to an embodiment of the disclosure.

Referring to FIG. 12, a method for operating a storage device 100 may include starting to send information on one or more candidate memory regions CAND_MR from among a plurality of memory regions MR to an external device EXT_DEVICE at a first time point TP1 (S1210).

The method for operating the storage device 100 may include loading all or a part of map segments MAP_SEG corresponding to the candidate memory regions CAND_MR into the buffer BUF after the first time point TP1 (S1220).

The buffer BUF may include a plurality of buffer slots BUF_SLOT. At the step S1220, all or a part of the map segments MAP_SEG corresponding to the candidate memory regions CAND_MR may be loaded into the plurality of buffer slots BUF_SLOT.

The method for operating the storage device 100 may include receiving a command requesting a map segment for a target memory region from among the plurality of memory regions MR at a second time point TP2 (S1230). The second time point TP2 is after the first time point TP1.

The method for operating the storage device 100 may include sending the map segment for the target memory region to the external device EXT_DEVICE (S1240).

The method for operating the storage device 100 may further include encoding in parallel all or a part of the map segments MAP_SEG loaded into the plurality of buffer slots BUF_SLOT according to a set encoding algorithm.

The encoding algorithm may be, for example, an algorithm that encrypts an inputted map segment according to a set encryption algorithm and additionally generates consistency information on the encrypted map segment.

An operation of loading one of the map segments MAP_SEG corresponding to the candidate memory regions CAND_MR into a first buffer slot and an operation of encoding a map segment MAP_SEG loaded into a second buffer slot may be executed in parallel.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A storage device comprising:
a memory including a plurality of memory regions; and
a controller configured to send information on one or more candidate memory regions selected from among the plurality of memory regions to an external device, and to load all or a part of map segments corresponding to the candidate memory regions into a buffer between a first time point when the information on the candidate memory regions begins to be sent to the external device and a second time point when a command requesting a map segment for a target memory region, from among the plurality of memory regions, is received from the external device.

2. The storage device according to claim 1, wherein the controller determines the candidate memory regions, from among the plurality of memory regions, as (i) memory regions whose counts of read operations by the external device for a preset time period are equal to or greater than a threshold count; (ii) memory regions in which sizes of data read by the external device for a preset time period are equal to or larger than a threshold data size; or (iii) an N (where N is a natural number) number of memory regions which are most recently accessed.

3. The storage device according to claim 1, wherein
the buffer includes a plurality of buffer slots, and
the controller loads all or a part of the map segments corresponding to the candidate memory regions into the plurality of buffer slots between the first time point and the second time point.

4. The storage device according to claim 3, wherein the controller sends information on a K number of candidate memory regions to the external device and the plurality of buffer slots numbers less than K.

5. The storage device according to claim 3, wherein, when the target memory region is not included in the one or more candidate memory regions, the buffer includes a reserved buffer slot used to load the map segment corresponding to the target memory region.

6. The storage device according to claim 3, wherein the controller encodes in parallel all or a part of map segments loaded into the plurality of buffer slots according to an encoding algorithm.

7. The storage device according to claim 6, wherein the encoding algorithm encrypts a map segment and generates consistency information on the encrypted map segment.

8. The storage device according to claim 6, wherein the controller executes in parallel an operation of loading one of the map segments corresponding to the candidate memory regions into a first buffer slot and an operation of encoding a map segment loaded into a second buffer slot.

9. The storage device according to claim 6, wherein
the controller includes a plurality of encoding circuits, and
each of the plurality of encoding circuits encodes one of the map segments loaded into the plurality of buffer slots.

10. A method for operating a storage device, comprising:
beginning to send information on candidate memory regions from among a plurality of memory regions to an external device at a first time point;
loading all or a part of map segments corresponding to the candidate memory regions into a buffer after the first time point;
receiving a command requesting a map segment for a target memory region from among the plurality of memory regions at a second time point; and
sending the map segment for the target memory region to the external device.

11. The method according to claim 10, wherein
the buffer includes a plurality of buffer slots, and
is the loading of all or a part of the map segments corresponding to the candidate memory regions into the buffer comprises loading all or a part of the map segments corresponding to the candidate memory regions into the plurality of buffer slots.

12. The method according to claim 11, further comprising:
encoding in parallel all or a part of map segments loaded into the plurality of buffer slots according to an encoding algorithm.

13. The method according to claim 12, wherein the encoding algorithm encrypts a map segment and generates consistency information on the encrypted map segment.

14. The method according to claim 12, wherein an operation of loading one of the map segments corresponding to the candidate memory regions into a first buffer slot and an operation of encoding a map segment loaded into a second buffer slot are executed in parallel.

15. A controller comprising:
a memory interface capable of communicating with a memory including a plurality of memory regions;
a host interface capable of communicating with a host; and
a control circuit configured to, after a host performance booster (HPB) recommend command indicating information on candidate memory regions among the plurality of memory regions is sent to the host and before an HPB read buffer command requesting a map segment for a target memory region among the plurality of memory regions is received from the host, load in advance all or a part of map segments corresponding to the candidate memory regions into a buffer.

* * * * *